(12) United States Patent
Bierhuizen et al.

(10) Patent No.: US 8,987,771 B2
(45) Date of Patent: Mar. 24, 2015

(54) CARRIER FOR A LIGHT EMITTING DEVICE

(71) Applicants: Serge J. Bierhuizen, Santa Rosa, CA (US); James G. Neff, Felton, CA (US)

(72) Inventors: Serge J. Bierhuizen, Santa Rosa, CA (US); James G. Neff, Felton, CA (US)

(73) Assignees: Koninklijke Philips N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 0 days.

(21) Appl. No.: 13/669,506

(22) Filed: Nov. 6, 2012

(65) Prior Publication Data

US 2013/0062651 A1 Mar. 14, 2013

Related U.S. Application Data

(63) Continuation of application No. 12/731,501, filed on Mar. 25, 2010, now Pat. No. 8,319,247.

(51) Int. Cl.
| | |
|---|---|
| H01L 33/48 | (2010.01) |
| H01L 33/62 | (2010.01) |
| H01L 33/54 | (2010.01) |
| H01L 33/64 | (2010.01) |

(52) U.S. Cl.
CPC ............ *H01L 33/486* (2013.01); *H01L 33/62* (2013.01); *H01L 33/54* (2013.01); *H01L 33/64* (2013.01); *H01L 2924/0002* (2013.01)
USPC ............ 257/99; 257/E33.066; 257/E33.058; 438/27; 438/28; 438/34

(58) Field of Classification Search
None
See application file for complete search history.

(56) References Cited

U.S. PATENT DOCUMENTS

| | | | |
|---|---|---|---|
| 4,837,184 A * | 6/1989 | Lin et al. .................... 29/593 |
| 6,133,589 A * | 10/2000 | Krames et al. ............. 257/103 |
| 6,197,615 B1 * | 3/2001 | Song et al. ................. 438/111 |
| 6,590,235 B2 | 7/2003 | Carey | |
| 6,670,222 B1 * | 12/2003 | Brodsky .................... 438/118 |
| 6,933,537 B2 * | 8/2005 | Yee et al. .................... 257/99 |
| 6,936,855 B1 * | 8/2005 | Harrah ......................... 257/88 |
| 7,109,570 B2 * | 9/2006 | Manalac et al. ............ 257/666 |
| 7,201,161 B1 | 4/2007 | York | |
| 7,321,161 B2 | 1/2008 | Tiexeira et al. | |
| 7,352,011 B2 | 4/2008 | Smits et al. | |
| 7,417,220 B2 | 8/2008 | Suehiro et al. | |
| 7,455,423 B2 | 11/2008 | Takenaka | |
| 7,538,359 B2 | 5/2009 | Eng et al. | |
| 7,700,964 B2 | 4/2010 | Morimoto et al. | |
| 7,855,389 B2 | 12/2010 | Ishikura et al. | |

(Continued)

FOREIGN PATENT DOCUMENTS

| | | |
|---|---|---|
| WO | 2006095949 A1 | 9/2006 |
| WO | 2009067985 A1 | 6/2009 |

OTHER PUBLICATIONS

DeMilo, C., "Thermally Induced Stresses Resulting from Coefficient of Thermal Expansion Differentials Between an LED Sub-mount Material and Various Mounting Substrates" SPIE Proceedings vol. 6486, Feb. 12, 2007.*

(Continued)

*Primary Examiner* — Joseph Schoenholtz (57) ABSTRACT

A semiconductor light emitting device is mounted on a support substrate. The support substrate is disposed in an opening in a carrier. In some embodiments, the support substrate is a ceramic tile and the carrier is a low cost material with a lateral extent large enough to support a lens molded over or attached to the carrier.

12 Claims, 5 Drawing Sheets

(56) References Cited

U.S. PATENT DOCUMENTS

| | | | |
|---|---|---|---|
| 8,044,495 B2* | 10/2011 | Abbott | 257/672 |
| 8,158,460 B2* | 4/2012 | Abbott | 438/123 |
| 8,558,259 B2 | 10/2013 | Wirth | |
| 8,696,159 B2 | 4/2014 | Andrews et al. | |
| 8,740,409 B2 | 6/2014 | Nakata et al. | |
| 2002/0088987 A1 | 7/2002 | Sakurai | |
| 2003/0020081 A1 | 1/2003 | Guida | |
| 2003/0168720 A1 | 9/2003 | Kamada | |
| 2003/0179548 A1 | 9/2003 | Becker et al. | |
| 2003/0189830 A1* | 10/2003 | Sugimoto et al. | 362/294 |
| 2004/0169451 A1 | 9/2004 | Oishi et al. | |
| 2004/0217364 A1 | 11/2004 | Tarsa et al. | |
| 2005/0161771 A1 | 7/2005 | Suehiro | |
| 2005/0248259 A1 | 11/2005 | Chang | |
| 2006/0012299 A1* | 1/2006 | Suehiro et al. | 313/512 |
| 2006/0043402 A1* | 3/2006 | Suehiro et al. | 257/99 |
| 2006/0180824 A1 | 8/2006 | Kim | |
| 2006/0261364 A1 | 11/2006 | Suehiro | |
| 2007/0063209 A1* | 3/2007 | Sugiura et al. | 257/98 |
| 2007/0223219 A1 | 9/2007 | Medendorp et al. | |
| 2007/0246726 A1 | 10/2007 | Lin | |
| 2007/0263384 A1 | 11/2007 | Hsieh et al. | |
| 2008/0001160 A1 | 1/2008 | Andrews | |
| 2008/0149960 A1* | 6/2008 | Amo et al. | 257/98 |
| 2008/0164484 A1 | 7/2008 | Lee | |
| 2008/0273340 A1 | 11/2008 | Ng et al. | |
| 2008/0290357 A1 | 11/2008 | Lin et al. | |
| 2008/0296751 A1 | 12/2008 | Fan | |
| 2009/0108281 A1 | 4/2009 | Keller et al. | |
| 2009/0134409 A1 | 5/2009 | Wang et al. | |
| 2009/0154176 A1 | 6/2009 | Matsuoka et al. | |
| 2009/0173963 A1 | 7/2009 | Hsu et al. | |
| 2009/0197360 A1* | 8/2009 | Han et al. | 438/26 |
| 2009/0230417 A1 | 9/2009 | Tsai | |
| 2009/0267093 A1 | 10/2009 | Kamada et al. | |
| 2009/0302340 A1 | 12/2009 | Ueji | |
| 2010/0025699 A1 | 2/2010 | Liu et al. | |
| 2010/0096658 A1 | 4/2010 | Wu et al. | |
| 2010/0252851 A1 | 10/2010 | Emerson et al. | |
| 2011/0057205 A1* | 3/2011 | Mueller et al. | 257/84 |
| 2011/0248616 A1 | 10/2011 | Lai | |
| 2011/0291129 A1 | 12/2011 | Wirth | |
| 2011/0316420 A1 | 12/2011 | Chang et al. | |
| 2012/0018764 A1* | 1/2012 | Choi et al. | 257/99 |

OTHER PUBLICATIONS

Lin, T.H., WLP Promise LED Price and Performance Benefits 3D Packaging Issue No Feb. 26, 2013,published by www-i-micronews.com downloaded from URL < http://www.yole.fr/iso_upload/mag/3d_fevrier_2013_mail.pdf > on Sep. 6, 2013 (Lin).*

Definition of undercut downloaded from URL <http://dictionary.reference.com/browse/undercut> on Jun. 26, 2014.*

Definition of undercut downloaded from URL< http://www.merriam-webster.com/dictionary/undercut> on Jun. 26, 2014.*

Definition of undercut downloaded from URL< http://www.oxforddictionaries.com/us/definition/american_english/undercut> on Jul. 3, 2014.*

Definition of opening downloaded from URL http://www.merriam-webster.com/dictionary/opening on Jul. 3, 2014.*

Definition of under downloaded from URL < http://www.merriam-webster.com/dictionary/under> on Jul. 3, 2014.*

SPI Silver Paste Plus—Physical Properties http:/www2spi.com/catalog/spec_prep/plus_prop.html accessed on 2/24/2-12.

Zweben, Carl, "Advances in LED Packaging and Thermal Management Materials" Proc. of SPIE 6910.18(2008) 6910018-1-91018-11.

Tang, C.Y, et al "Thermal Measurements and Analysis of Flip-Chip LED Packages with and without Underfills" Microsystems Packaging Assembly and Circuits Technology Conference (Impact) 2010 5th International, vol. No. pp. 1-4 Oct. 20-22, 2010.

Moo Whan Shin "Thermal Design of High-Power LED Package and System" Proc. SPIE 6355 635509 (2006).

Henning Dieker et al "Comparison of Different LED Packages" Proc. SPIE 6797, 679701 (2007).

* cited by examiner

CARRIER FOR A LIGHT EMITTING DEVICE

CROSS-REFERENCE TO RELATED APPLICATIONS

This is a continuation of U.S. application Ser. No. 12/731,501, filed Mar. 25, 2010, titled "Carrier for a Light Emitting Device", and incorporated herein by reference.

BACKGROUND

1. Field of Invention

The present invention relates to a carrier for a semiconductor light emitting device.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

Figure 1:
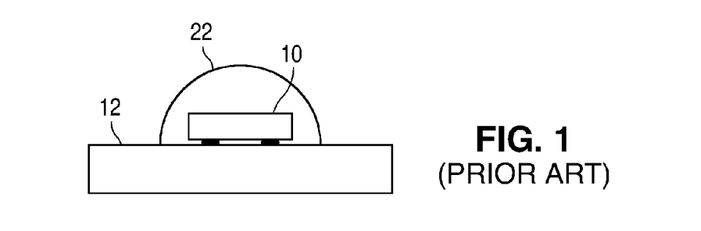
FIG. 1 illustrates a prior art LED mounted on a support structure and covered with a molded lens.

FIG. 1 illustrates an LED described in more detail in U.S. Pat. No. 7,352,011, which is incorporated herein by reference. An LED 10 is mounted on a support structure 12, which may be "a ceramic submount with metal pads/leads." A lens 22 is molded over LED 10. Lens 22 may be formed as follows: a mold in the shape of lens 22 is positioned over LED 10. The mold may be lined with a non-stick film. The mold is filled with a suitable transparent heat-curable liquid lens material such as silicone or epoxy. A vacuum seal is created between the periphery of the support structure 12 and the mold, and the two pieces are pressed against each other so that each LED die 10 is inserted into the liquid lens material and the lens material is under compression. The mold is then heated to about 150 degrees centigrade (or other suitable temperature) for a time to harden the lens material. The support structure 12 is then separated from the mold.

Support structure 12 must be significantly larger than LED 10, as illustrated in FIG. 1, in order to support molded lens 22. Such a large support structure may appreciably increase the cost of the device.

SUMMARY

It is an object of the invention to provide a carrier for a light source.

In embodiments of the invention, a semiconductor light emitting device is mounted on a support substrate. The support substrate is disposed in an opening in a carrier. In some embodiments, the support substrate is a ceramic tile and the carrier is a low cost material with a lateral extent large enough to support a lens molded over or attached to the carrier.

DETAILED DESCRIPTION

In embodiments of the invention, a light emitting device such as an LED is mounted on a support substrate such as a ceramic tile. The ceramic tile may be the minimum size necessary to mechanically support the LED, to provide electrical connection of the LED to another structure, and to provide a thermal path to spread heat from the LED. The ceramic tile is positioned in and may be attached to a carrier. The carrier may be a low cost, moldable material that is robust enough to protect the LED and ceramic tile from shock. The carrier material may be selected to withstand the conditions necessary to attach the ceramic tile to the carrier and to form or attach a lens or other structure over the LED. For example, the ceramic tile may be attached to the carrier by soldering, wire bonding, micro-soldering, micro-welding, a compliant bonding structure such as a series of metal bumps, gold-gold interconnects formed by ultrasonic or thermosonic bonding, bonding for example with silver epoxy, mechanical clamping such as spring-force clamping, or surface mounting. The support substrate may be mechanically attached to the carrier through the top or side surfaces, or through a lens formed or attached over the support substrate and carrier, leaving the bottom of the support substrate available to make electrical and/or thermal contact with another structure such as a user-supplied PC board. The device including the LED, support substrate, and carrier may be attachable to another structure such as a PC board. Examples of suitable carriers include sheet metal that may be stamped and bent into a desired shape, and plastic such as polyphthalamide (PPA). Multiple materials may be used, such as sheet metal that is attached to PPA, any other suitable type of plastic or polymer, or a dielectric insulator.

As a preliminary matter, though in the examples below the light emitting device is a III-nitride thin film flip chip LED, other light emitting devices may be used, including LEDs or other semiconductor devices made from other materials systems such as III-V materials, III-nitride materials, III-phosphide materials, III-arsenide materials, II-VI materials, and group IV materials.

A conventional III-nitride LED 10 is formed by first growing a semiconductor structure on a growth substrate. An n-type region is typically grown first and may include multiple layers of different compositions and dopant concentration including, for example, preparation layers such as buffer layers or nucleation layers, which may be n-type or not intentionally doped, release layers designed to facilitate later release of the substrate or thinning of the semiconductor structure after substrate removal, and n- or even p-type device layers designed for particular optical or electrical properties desirable for the light emitting region to efficiently emit light. A light emitting or active region is grown over the n-type region. Examples of suitable light emitting regions include a single thick or thin light emitting layer, or a multiple quantum well light emitting region including multiple thin or thick quantum well light emitting layers separated by barrier layers. A p-type region is grown over the light emitting region. Like the n-type region, the p-type region may include multiple layers of different composition, thickness, and dopant concentration, including layers that are not intentionally doped, or n-type layers.

Various techniques are used to gain electrical access to the n-type layers. Portions of the p-type layers and active layer may be etched away to expose an n-type layer for metallization. In this way the p-contact and n-contact are on the same side of the chip and can be directly electrically attached to contact pads on a suitable mount. Light may be extracted from the top surface of the device (i.e. the surface on which the contacts are formed) or from the bottom surface of the device (i.e. in a flip chip device, a device with at least one reflective contact that is flipped over relative to the growth direction). In a flip chip, the growth substrate may be removed from the semiconductor structure (a thin film device) or may remain a part of the completed device. After substrate removal, the semiconductor structure may be thinned, and the surface of the n-type region exposed by removing the substrate may be textured to improve light extraction, for example by roughening or forming a photonic crystal structure. In a vertical injection LED, an n-contact is formed on one side of the semiconductor structure, and a p-contact is formed on the other side of the semiconductor structure. Electrical contact to one of the p- or n-contacts is typically made with a wire or a metal bridge, and the other contact is directly bonded to a contact pad on the support substrate. Though the examples below include a thin film flip chip device, any suitable device structure may be used.

The LED may be mounted on a support substrate 12. Though in the examples below the support substrate 12 is a ceramic tile, any suitable support substrate 12 may be used. In some embodiments, the support substrate is a growth substrate on which the III-nitride structure is grown. In these embodiments, the LED is directly connected to the carrier without an additional support substrate.

One or more wavelength converting materials such as phosphors or dyes may be disposed over the LED. An LED combined with one or more wavelength converting materials may be used to create white light or monochromatic light of other colors. All or only a portion of the light emitted by the LED may be converted by the wavelength converting material. Unconverted light may be part of the final spectrum of light, though it need not be. Examples of common combinations include a blue-emitting LED combined with a yellow-emitting phosphor, a blue-emitting LED combined with green- and red-emitting phosphors, a UV-emitting LED combined with blue- and yellow-emitting phosphors, and a UV-emitting LED combined with blue-, green-, and red-emitting phosphors. Examples of suitable wavelength converting layers include pre-formed ceramic phosphor layers that are glued or bonded to the LED, or a powder phosphor disposed in a transparent encapsulant such as silicone that is stenciled, screen printed, sprayed, evaporated, sputtered, sedimented, dispensed, spin-coated, or otherwise positioned over the LED. Different types of wavelength converting layers may be used. Multiple wavelength converting materials may be mixed and formed in a single layer or formed as discrete layers.

Figure 14:
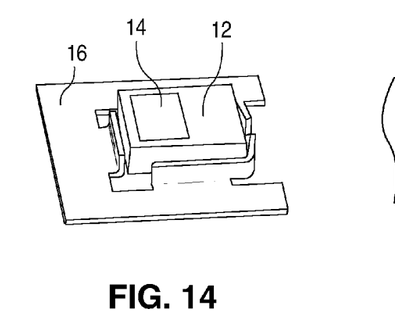
FIG. 14 illustrates an LED mounted on a support substrate and positioned in an opening in a carrier.

FIG. 14 illustrates a device according to embodiments of the invention. A wavelength converting member 14 is positioned over an LED mounted on a support substrate 12. The support substrate is positioned in an opening in a carrier 16. The carrier illustrated in FIG. 14 may be formed from stamped and bent sheet metal.

Figure 2:
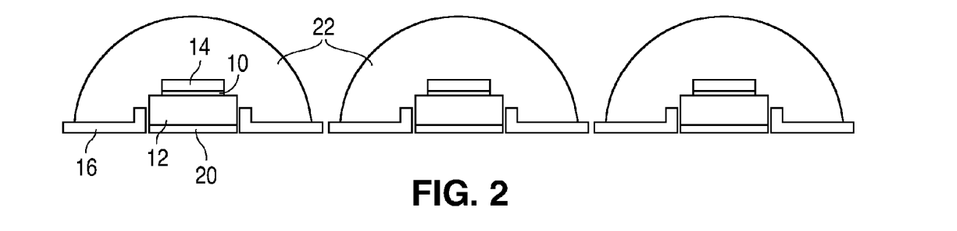
FIG. 2 illustrates LEDs mounted on support substrates and connected to carriers.
Figure 3:
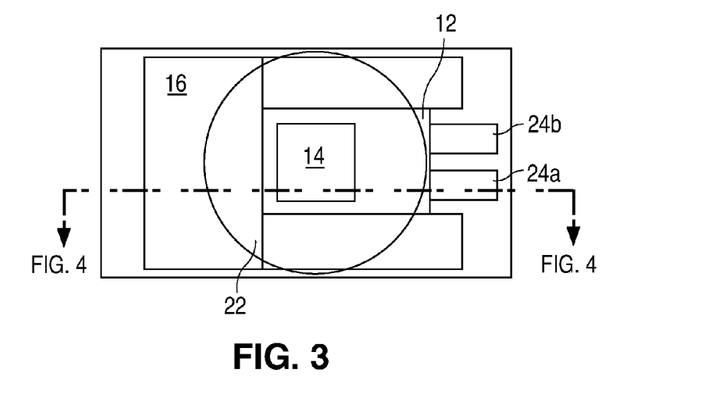
FIG. 3 is a top view of one of the devices shown in FIG. 2.
Figure 4:
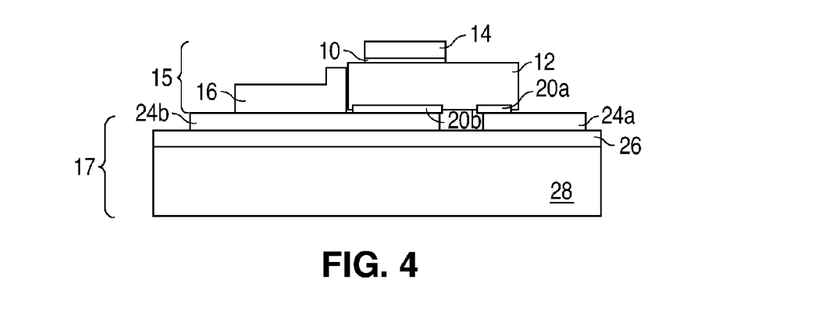
FIG. 4 is a cross sectional view of the device shown in FIG. 3 minus the lens, along the axis shown in FIG. 3.

FIGS. 2-4 illustrate devices according to embodiments of the invention where electrical contact to the LED 10 is established through the bottom surface of the ceramic tile 12 on which LED 10 is mounted. FIG. 2 illustrates three LEDs 10 mounted on ceramic tiles 12. LEDs 10 are electrically and physically connected to contacts on the top of ceramic tiles 12 by any suitable interconnect such as, for example, solder or gold. A wavelength converting member 14 may be disposed on a top surface of LED 10. Each ceramic tile 12 is fit in a slot formed in a carrier 16. Ceramic tile 12 may be soldered to carrier 16 at the sides of ceramic tile 12. Lenses 22 may be molded over each LED 10. Lens 22 covers LED 10, ceramic tile 12, and all or a portion of carrier 16. Alternatively, a pre-formed lens may be attached to carrier 16 over LED 10. Electrical contacts 20 on the bottom of ceramic tile 12 permit electrical connection of LED 10 to another structure not shown in FIG. 2, such as a user's PC board. Electrical contacts 20 may be electrically connected to top contacts on ceramic tile 12 by, for example, vias formed in ceramic tile 12 which are filled with conductive material such as metal.

FIG. 3 is a top view of one of the devices of FIG. 2 after being connected to a PC board. FIG. 4 is a cross sectional view of the structure of FIG. 3 along the axis shown in FIG. 3. PC board 17 may be a commercially available PC board that includes a heat spreading metal core 28 such as Al or Cu, an insulating layer 26 such as a dielectric, and positive and negative electrical traces 24a and 24b which are electrically isolated from each other by insulating layer 26. The structure 15, which includes LED 10, optional wavelength converting element 14, ceramic tile 12, contacts 20, and carrier 16, plus the lens 22 may be fabricated separately, then attached to PC board 17 as a single structure. N- and p-contacts 20a and 20b on ceramic tile 12 may be soldered or bonded to electrical traces 24a and 24b on PC board 17. Alternatively, heat spreading layer 28 may be electrically or physically connected to either n- or p-contact 20a or 20b and may be used with or instead of electrical traces 24a or 24b.

In the devices illustrated in FIGS. 2-4, heat is conducted away from LED 10 through contacts 20 on the bottom of ceramic tile 12. The electrical isolation required between the positive and negative electrical contacts 20 reduces the area on the bottom of ceramic tile 12 available for conducting heat, which may reduce the amount of heat that can be conducted away from LED 10.

Figure 5:
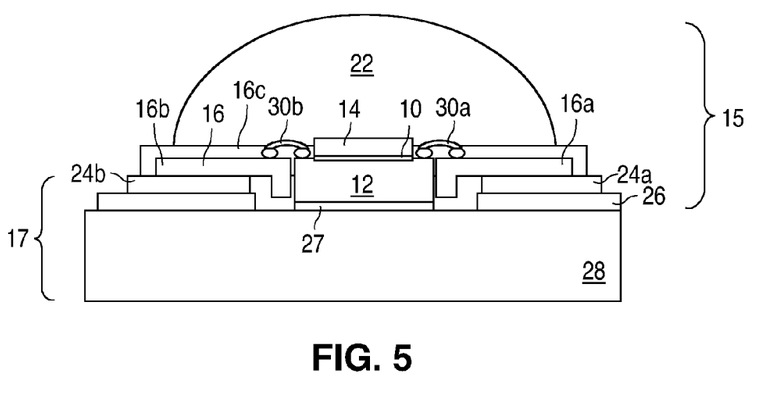
FIG. 5 illustrates an LED mounted on a support substrate and electrically connected to a carrier by wire bonds on the top surface of the support substrate. The carrier is shown mounted on a user-supplied PC board.
Figure 6:
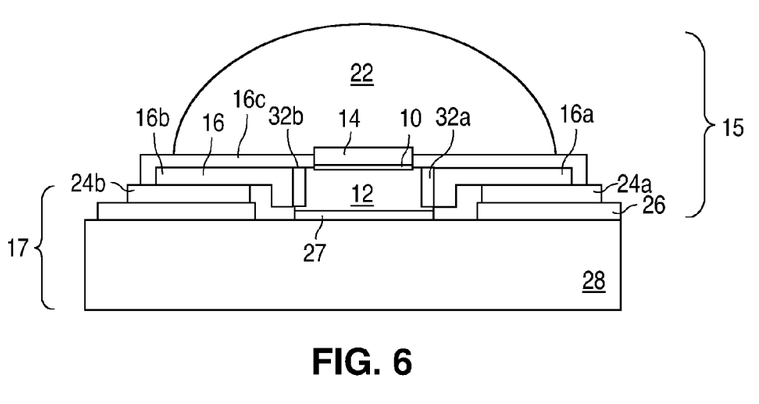
FIG. 6 illustrates an LED mounted on a support substrate and electrically connected to a carrier by electrical connections on the sides of the support substrate. The carrier is shown mounted on a user-supplied PC board.
Figure 7:
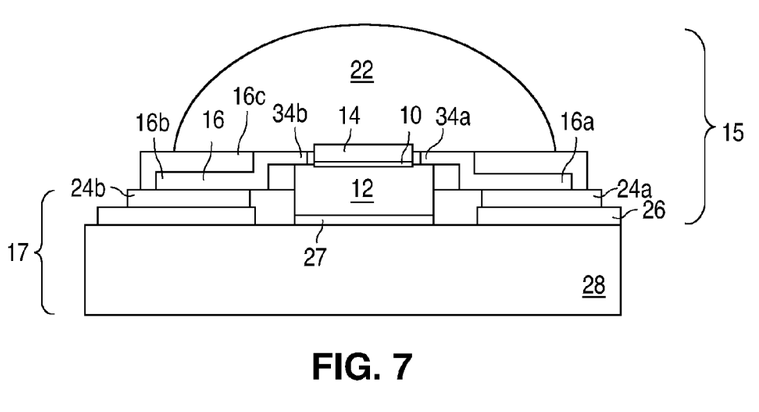
FIG. 7 illustrates an LED mounted on a support substrate and connected to a carrier by connections on the top surface of the support substrate. The carrier is shown mounted on a user-supplied PC board.

In the devices illustrated in FIGS. 5-8, electrical contact to the LED 10 is established through the top surface of the ceramic tile 12, which leaves the entire bottom surface of ceramic tile 12 available to conduct heat away from LED 10. The ceramic tile 12 may be mechanically connected to carrier 16 by the electrical connection between ceramic tile 12 and carrier 16, by an adhesive or glue such as silicone, solder, or epoxy disposed between ceramic tile 12 and carrier 16, or by a lens molded or attached over ceramic tile 12 and carrier 16. In the case where a lens connects ceramic tile 12 to carrier 16, the carrier and ceramic tile need not touch each other. The devices of FIGS. 5-7 are shown mounted on PC boards.

In the devices illustrated in FIGS. 5-8, the two sides 16a and 16b of carrier 16 may be electrically isolated from each other for example by being connected to an optional insulating element 16c of carrier 16. Alternatively, ceramic tile 12 may be positioned in an opening in a sheet of carriers that are connected together. Electrical connections between ceramic tile 12 and carrier 16 are then formed. A lens may be molded over the carrier 16 and ceramic tile 12 to mechanically connect the carrier 16 and ceramic tile 12, or the mechanical connection between the carrier 16 and ceramic tile 12 may be the same as the electrical connection. The two sides of 16a and 16b of carrier 16 are then electrically isolated from each other by stamping the individual carrier out of the sheet of carriers such that the two sides of the carrier are separated.

As described above, the structure 15, including LED 10, ceramic tile 12, optional wavelength converting element 14, carrier 16, and lens 22 may be formed separately. Structure 15 is mounted by a user as a single piece on PC board 17 or any other suitable structure.

In the device of FIG. 5, ceramic tile 12 is electrically connected to carrier 16 by wire bonds 30a and 30b as illustrated in FIG. 5, or by micro-soldering, micro-welding, or flex foil. Wire bond 30a may be electrically connected to one of the n- and p-contacts of LED 10 by a contact on the top surface of ceramic tile 12. Wire bond 30b may be electrically connected to the other of the n- and p-contacts of LED 10 by a contact on the top surface of ceramic tile 12.

The sides 16a and 16b of carrier 16, which are electrically connected to the LED through wire bonds 30a and 30b to support substrate 12, may be physically and electrically connected to PC board 17 through traces 24a and 24b, for example by solder. Traces 24a and 24b are electrically isolated from each other by insulating layer 26. The bottom surface of ceramic tile 12 may be directly connected to the heat spreading layer 28 of the PC board by a thermally conductive material 27, such as, for example, solder. Ceramic tile 12 and thermally conductive material 27 form a thermal path that conducts heat away from LED 10. Since wire bonds 30a and 30b provide electrical connection to LED 10, thermally conductive material 27 need not be electrically conductive.

In the device of FIG. 6, ceramic tile 12 is electrically connected to carrier 16 by electrical connections 32a and 32b on the sides of ceramic tile 12. Electrical connections 32a and 32b are electrically connected to contacts on the top surface of ceramic tile on which LED 10 is mounted on by, for example, traces on the top and side surfaces of ceramic tile 12 or vias through ceramic tile 12 which are filled with electrically conductive material. Electrical connections 32a and 32b may be, for example, solder. Connection between each side of ceramic tile 12 and carrier 16 may be accomplished in a single electrical and physical connection or in separate electrical and physical connections. As in FIG. 5, carrier 16 may be electrically and physically connected to PC board 17 through traces 24a and 24b and ceramic tile 12 may be directly connected to the heat spreading layer 28 of PC board 17 by a thermally conductive material 27.

In the device of FIG. 7, ceramic tile 12 is electrically connected to carrier 16 through connections 34a and 34b on the top surface of ceramic tile 12. Connections 34a and 34b may be, for example, solder, which directly connect two electrically isolated parts 16a and 16b of carrier 16 to contacts on the top surface of ceramic tile 12. As in FIG. 5, carrier 16 may be electrically and physically connected to PC board 17 through traces 24a and 24b and ceramic tile 12 may be directly connected to the heat spreading layer 28 of PC board 17 by a thermally conductive material 27. In some embodiments, connections 34a and 34b are formed on the bottom of a pre-formed lens that is attached over LED 10 in contact with the top surface of support substrate 12 and carrier 16.

Figure 8:
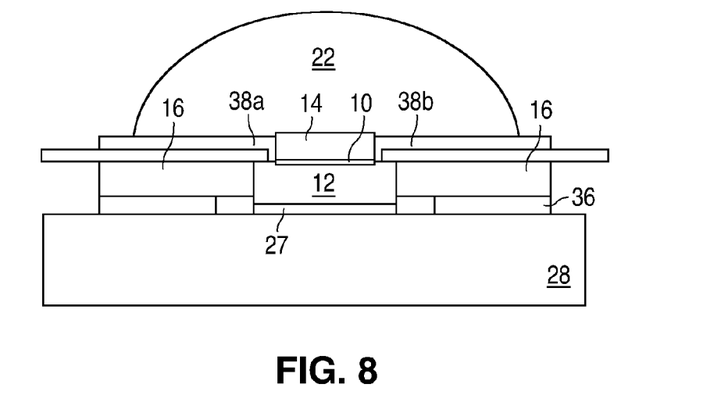
FIG. 8 illustrates an LED mounted on a support substrate and connected to a carrier by connections on the top surface of the support substrate to external contacts on the carrier. The carrier is shown mounted on a user-supplied PC board.

In the device of FIG. 8, carrier 16 includes external contacts 38a and 38b. External contacts 38a and 38b are electrically connected to top contacts on ceramic tile 12 by, for example, solder. Ceramic tile 12 may be physically connected to carrier 16 by the connection to external contacts 38a and 38b or by a separate connection, for example at the sides of ceramic tile 12. External contacts may be electrically connected to a structure such as a PC board by, for example, screws, clips, or flex foil. Ceramic tile 12 is connected to a heat spreading layer 28, which may be part of a PC board or any other suitable structure, by thermally conductive material 27. Carrier 16 may be physically connected to heat spreading layer 28 by, for example, solder or any other suitable connection. Optional shims 36 may be disposed between heat spreading layer 28 and carrier 16 to position carrier 16 at the appropriate height.

In some embodiments, as illustrated in FIGS. 4-8, the carrier may be thin enough that the top surface of the wavelength converting element 14 or LED 10 is at a higher elevation than the top surface of the carrier, and/or the bottom surface of the support substrate is at a lower elevation than the bottom surface of the carrier. In some embodiments, the difference between the elevation of the bottom of the carrier and the bottom of the support substrate is selected to accommodate a structure such as a PC board. For example, as illustrated in FIGS. 5-7, a PC board includes a metal core 28, an insulating layer 26, and traces 24a and 24b. The difference between the elevation of the bottom of the carrier and the bottom of the support substrate is selected such that the support substrate rests on or is easily connected to the metal core, while the carrier rests on or is easily connected to the traces, for example by solder or any other suitable electrically conductive connection.

Figure 9:
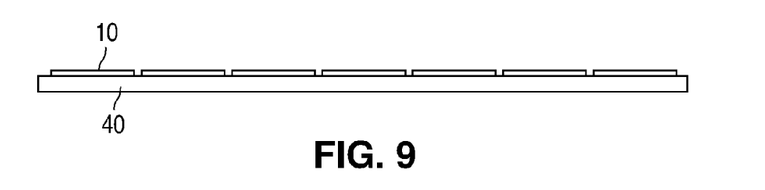
FIG. 9 illustrates LEDs grown on a growth substrate wafer.
Figure 16:
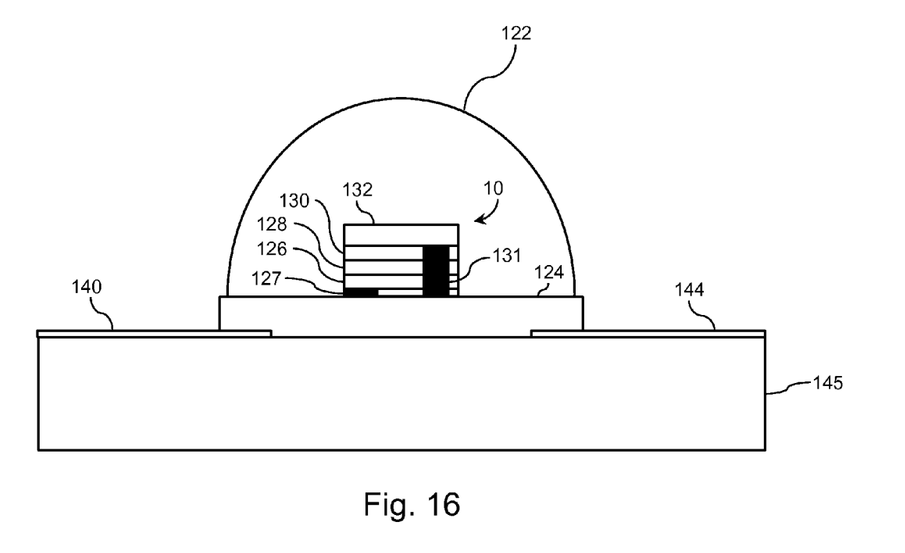
FIG. 16 illustrates an exemplary flip-chip LED 10 after removal of the growth substrate.

FIGS. 9-13 illustrate forming devices according to embodiments of the invention. In FIG. 9, LEDs 10 are grown on a growth substrate 40. FIG. 16 shows an exemplary chip LED 10 after removal of the growth substrate 40. LED 10 may be etched through a p-contact 126, p-type region. 128 and light emitting layer 130 to form, a mesa that exposes a portion of the n-type region 132. Forming of n-type contact 131 and p-type contact 126, may be performed at this stage. As described above the growth substrate 40 may be remove or may remain part of the device. The wafer shown in FIG. 9 may be diced into individual LEDs.

Figure 10:
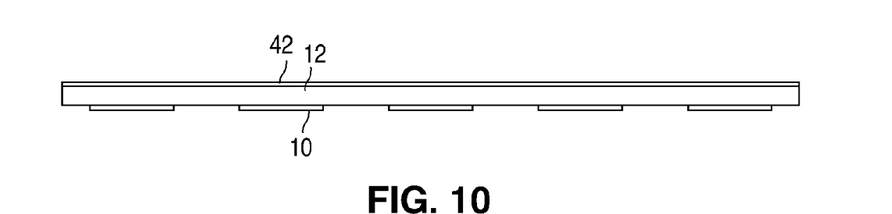
FIG. 10 illustrates LEDs mounted on a support substrate wafer.

In FIG. 10, LEDs 10 are mounted on a wafer of support substrates 12 such as ceramic tiles, for example by soldering or thermosonic bonding of gold-gold interconnects. Any necessary structure 42 on the support substrate 12, such as through-vias or electrical contacts, may be formed before or after mounting LEDs 10 on support substrates 12.

Figure 11:
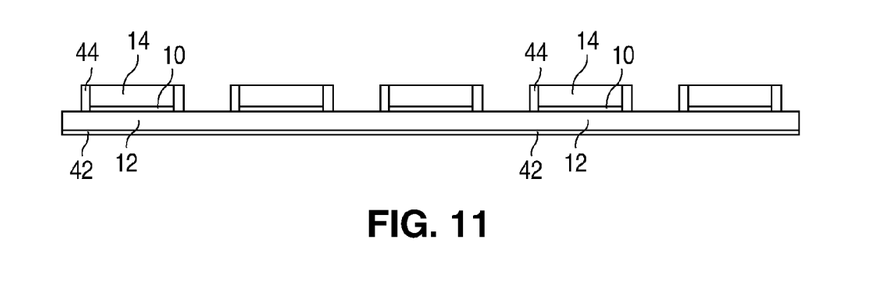
FIG. 11 illustrates wavelength converting elements disposed on LEDs.

In FIG. 11, wavelength converting elements 14 are disposed on LEDs 10. Wavelength converting elements 14 may be, for example, pre-formed ceramic phosphor sheets that are glued or bonded to LEDs 10, or powder phosphor that is electrophoretically deposited, sprayed, sedimented, evaporated, or sputtered, or mixed with a transparent binder material that is stenciled, screen printed, sprayed, sedimented, spin-coated, or deposited over LEDs 10. An optional side coating 44 may be formed on wavelength converting element 14 and LED 10 if necessary, for example to reduce the amount of light that escapes through the sides of wavelength converting element 14 and LED 10.

Figure 12:
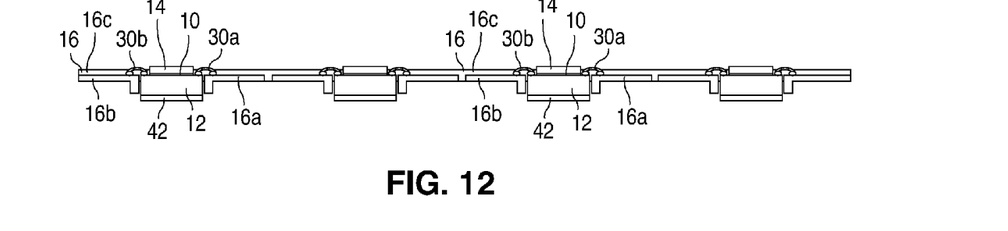
FIG. 12 illustrates LEDs mounted on support substrates and attached to carriers.

The wafer of support substrates 12 shown in FIGS. 10 and 11 may then be diced into individual devices. Multiple LEDs may be formed on a single support substrate. Each support substrate 12 is positioned in an opening in a carrier. The support substrate may optionally be directly connected to the carrier, for example by solder or adhesive disposed on the sides of support substrate 12. Multiple support substrates can be connected to a single carrier. Electrical connections to LED 10 are formed. Though the electrical connections shown in FIG. 12 are wire bonds 30a and 30b, any suitable electrical connection such as the electrical connections described in reference to FIGS. 2-8 may be used.

In some embodiments, support substrates 12 are attached to carrier 16 on a non-adhesive work surface, such as Teflon, to prevent adhesive such as silicone used to attach carrier 16 to support substrate 12 from attaching to the work surface. In some embodiments, indentations may be formed in the work surface which align with the support substrates 12, to position the bottoms of support substrates 12 at a lower elevation than the bottoms of carriers 16, as illustrated in FIGS. 5-8 and described above.

Figure 13:
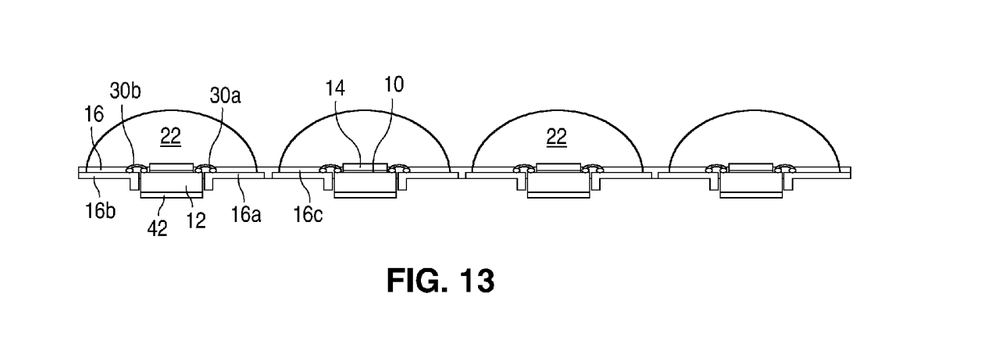
FIG. 13 illustrates lenses molded over LEDs.

In FIG. 13, lenses 22 are molded over LEDs 10, or a pre-formed lens is attached over LEDs 10. Lenses 22 may be formed, for example, by overmolding as described in U.S. Pat. No. 7,352,011. In some embodiments, an overmolded lens attaches the carrier to the support substrate. Lenses may be formed over multiple LEDs disposed on a single carrier. Lens 22 may be any suitable shape, and may cover multiple LEDs. In some embodiments, lenses 22 are attached such that a gap, often filled with air, is disposed between the LED and the lens. In some embodiments, a structure that is not a lens is molded over or attached over LED 10, to protect LED 10, or no structure or lens is provided over LED 10, support substrate 12, and carrier 16.

Figure 15:
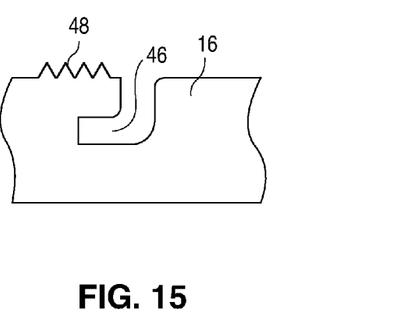
FIG. 15 illustrates a portion of a carrier including features that encourage adhesion of an overmolded lens.

In some embodiments, features which improve the adhesion of an over-molded lens may be included on carrier 16, as illustrated in FIG. 15. For example, the top surface of carrier 16 may be roughened or patterned with features 48. An undercut opening 46 may be formed in carrier 16. Lens material may fill undercut opening 46 during the molding process, which may secure the molded lens to carrier 16.

Embodiments of the invention may have advantages over other light sources. The support substrate is generally expensive relative to the carrier. The size of the support substrate is reduced in embodiments of the invention, which may reduce the cost of the device. In embodiments where electrical contact to the LED is made through the top surface of the support substrate, the bottom surface of the support substrate is available as a thermal path to conduct light away from the LED, which may improve light output from the device. The carrier, support substrate and LED, and lens are formed into a single unit which may then be mounted by a user, for example on a PC board. Top-surface contacts such as wire bonds and the lens may be formed not by the user, but rather under conditions that can be tightly controlled, which may prevent damage to the contacts and may prevent variation in the color of light emitted in the device caused by a user-applied lens.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A structure comprising:
   a semiconductor light emitting device;
   a support substrate, wherein the semiconductor light emitting device is mounted on the support substrate;
   a carrier having a first opening and a second opening,
      wherein the support substrate is disposed in the first opening;
      wherein the support substrate does not touch the carrier;
      wherein the second opening undercuts a top surface of the carrier; and
   a transparent structure disposed over the semiconductor light emitting device and in the second opening, wherein the transparent structure mechanically connects a top surface of the support substrate to the carrier.

2. The structure of claim 1 wherein the transparent structure is molded over the semiconductor light emitting device, support substrate, and carrier.

3. The structure of claim 1 wherein a side surface of the support substrate is not connected to the carrier.

4. The structure of claim 1 wherein support substrate is not mechanically connected to the carrier except through the transparent structure.

5. The structure of claim 1 wherein the support substrate is ceramic.

6. The structure of claim 1 where the semiconductor light emitting device is electrically connected to the support substrate and is not electrically connected to the carrier.

7. The structure of claim 1 further comprising a PC board, wherein the support substrate is mounted on the PC board and the semiconductor light emitting device is electrically connected to the PC board through the support substrate.

8. The structure of claim 1 wherein the support substrate comprises top and bottom contacts, the semiconductor light emitting device is electrically connected to the support substrate through the top contacts, and the top contacts are electrically connected to the bottom contacts through vias in the support substrate filled with conductive material.

9. The structure of claim 1 wherein the transparent structure is a lens.

10. The structure of claim 1 wherein the carrier comprises one of sheet metal, polyphthalamide, polymer, plastic, and dielectric insulator.

11. A method comprising:
   growing on a growth substrate a semiconductor structure comprising a. light emitting layer disposed between ann-type region and a p-type region;
   etching the semiconductor structure to form a mesa that exposes a portion of then-type region;
   forming an n-contact on then-type region and p-contact on the p-type region;

mounting the semiconductor structure on a wafer of support substrates by one of soldering and thermosonic bonding;

dicing the wafer of support substrates into a plurality of support substrates;

positioning each of the support substrates in an opening in a carrier; and mechanically attaching the carrier to the support substrate by forming a transparent structure connected to a top surface of the support substrate and a top surface of the carrier.

12. A method comprising:

providing a semiconductor light emitting device mounted on a support substrate;

positioning the support substrate in an opening in a carrier;

roughening and/or patterning a top surface of the carrier; and mechanically attaching the carrier to the support substrate by forming a transparent structure connected to a top surface of the support substrate and a top surface of the carrier.

* * * * *